(12) United States Patent
Zhu et al.

(10) Patent No.: US 10,203,600 B2
(45) Date of Patent: Feb. 12, 2019

(54) PHOTORESIST BOTTLE CAPABLE OF IMPROVING POOR COATING COVERAGE

(71) Applicant: SHANGHAI HUALI MICROELECTRONICS CORPORATION, Shanghai (CN)

(72) Inventors: Zhiguo Zhu, Shanghai (CN); Jun Zhu, Shanghai (CN); Lijun Chen, Shanghai (CN)

(73) Assignee: SHANGHAI HUALI MICROEELCTRONICS CORPORATION, Shanghai (CN)

( * ) Notice: Subject to any disclaimer, the term of this patent is extended or adjusted under 35 U.S.C. 154(b) by 50 days.

(21) Appl. No.: 15/333,105

(22) Filed: Oct. 24, 2016

(65) Prior Publication Data
US 2017/0123311 A1 May 4, 2017

(30) Foreign Application Priority Data
Oct. 29, 2015 (CN) .......................... 2015 1 0724265

(51) Int. Cl.
| | |
|---|---|
| *G03F 7/00* | (2006.01) |
| *B65D 1/02* | (2006.01) |
| *B65D 23/02* | (2006.01) |
| *C23C 14/48* | (2006.01) |

(52) U.S. Cl.
CPC .............. *G03F 7/003* (2013.01); *B65D 1/02* (2013.01); *B65D 23/02* (2013.01); *C23C 14/48* (2013.01); *G03F 7/0012* (2013.01)

(58) Field of Classification Search
CPC ....... G03F 7/003; G03F 7/0012; C23C 14/48; B65D 1/02; B65D 23/02

USPC .... 222/386.5, 464.1–464.7, 399, 400.7, 382, 222/92–107
See application file for complete search history.

(56) References Cited

U.S. PATENT DOCUMENTS

| | | | | |
|---|---|---|---|---|
| 2,347,123 A | * | 4/1944 | Riesgo ................. | B67D 1/0802 138/39 |
| 3,083,875 A | * | 4/1963 | Welty .................... | B05B 9/0838 141/21 |
| 3,129,855 A | * | 4/1964 | Malakoff ............... | B65D 83/32 222/394 |

(Continued)

*Primary Examiner* — Paul R Durand
*Assistant Examiner* — Andrew P Bainbridge
(74) *Attorney, Agent, or Firm* — Tianchen LLC

(57) ABSTRACT

A photoresist bottle capable of improving poor coating coverage is disclosed, which comprising: a sealed photoresist bottle body having a connector, a hard groove-shaped projection fixed on the bottom of the bottle body, an inner liner having an opening at the bottom, which is hermetically connected to the groove sidewall of the projection and is used to fill with the photoresist, a nitrogen gas tube inserting into the interspace between the bottle body and the soft liner through the connector, and a photoresist conduit inserting into the soft liner through the connector. Wherein, the top of the inner liner is hermetically connected to the upper lateral wall of the photoresist conduit, the lower end of the photoresist conduit reaches within the groove of the projection. When the soft liner is pressured, since unable to touch the photoresist outlets at the lower end of the photoresist conduit, a blocking can be avoided. Thereby, air bubbles and coating problems are prevented.

13 Claims, 4 Drawing Sheets

(56) References Cited

U.S. PATENT DOCUMENTS

| | | | | |
|---|---|---|---|---|
| 3,371,822 A * | 3/1968 | Galloway | ............... | A23G 9/045 |
| | | | | 220/86.1 |
| 3,419,193 A * | 12/1968 | Stewart | ............... | F42D 1/10 |
| | | | | 222/183 |
| 3,482,738 A * | 12/1969 | Bartels | ............... | B65D 83/62 |
| | | | | 222/107 |
| 3,549,050 A * | 12/1970 | Bruce | ............... | B65D 83/62 |
| | | | | 222/402.22 |
| 3,569,753 A * | 3/1971 | Babikyan | ............... | H02K 21/24 |
| | | | | 310/268 |
| 4,630,759 A * | 12/1986 | Dawn | ............... | B67D 7/58 |
| | | | | 222/372 |
| 4,781,313 A * | 11/1988 | Verheyen | ............... | B65D 47/06 |
| | | | | 222/464.2 |
| 4,949,871 A * | 8/1990 | Flanner | ............... | B65D 83/62 |
| | | | | 222/386.5 |
| 5,366,119 A * | 11/1994 | Kline | ............... | B05B 11/0037 |
| | | | | 222/180 |
| 5,749,500 A * | 5/1998 | Kraus | ............... | B65D 25/02 |
| | | | | 222/377 |
| 5,915,595 A * | 6/1999 | Dow | ............... | B65D 83/62 |
| | | | | 222/105 |
| 6,257,446 B1 * | 7/2001 | Pike | ............... | B65D 75/5883 |
| | | | | 222/464.7 |
| 7,308,991 B2 * | 12/2007 | Alberg | ............... | B65D 23/02 |
| | | | | 156/291 |
| 8,114,479 B2 * | 2/2012 | Spohn | ............... | C23C 16/4409 |
| | | | | 118/715 |
| 2006/0163292 A1 * | 7/2006 | Wauters | ............... | B67D 1/0462 |
| | | | | 222/464.2 |
| 2011/0108580 A1 * | 5/2011 | Koh | ............... | B05B 11/0037 |
| | | | | 222/377 |
| 2012/0006855 A1 * | 1/2012 | Ehrmann | ............... | B05B 11/0037 |
| | | | | 222/377 |
| 2013/0193164 A1 * | 8/2013 | Tom | ............... | B65D 25/16 |
| | | | | 222/95 |
| 2013/0327790 A1 * | 12/2013 | Ryan | ............... | F16N 19/00 |
| | | | | 222/95 |
| 2014/0117043 A1 * | 5/2014 | Ware | ............... | B65D 85/84 |
| | | | | 222/95 |
| 2014/0353338 A1 * | 12/2014 | Huber | ............... | A01M 7/0032 |
| | | | | 222/318 |
| 2015/0102070 A1 * | 4/2015 | Mueh | ............... | B67D 7/025 |
| | | | | 222/400.7 |
| 2017/0123311 A1 * | 5/2017 | Zhu | ............... | B65D 1/02 |

* cited by examiner

PHOTORESIST BOTTLE CAPABLE OF IMPROVING POOR COATING COVERAGE

CROSS-REFERENCE TO RELATED APPLICATION

This application claims the priority benefit of China patent application serial No. 201510724265.0, filed Oct. 29, 2015. The entirety contents of the above-mentioned patent application are hereby incorporated by reference herein and made a part of the specifications.

FIELD OF THE INVENTION

The present invention relates to the field of semiconductor IC manufacturing technology, and particularly to a photoresist bottle capable of improving poor coating coverage.

BACKGROUND OF THE INVENTION

In the semiconductor manufacturing technology, the mechanism of the lithograph process is that copying temporary circuit configurations onto a wafer to be performed an etching and an ions implantation. Photosensitive photoresist material and controllable exposure ware are used to form three-dimensional patterns on the wafer surface. The photosensitive photoresist material or the photoresist material applied to the lithograph process, as a polymerized dissoluble compound, is coated on the wafer surface and patterned, then removed after the etching or the ions implantation. Therefore, the thickness and the uniformity of the photoresist material coated on the wafer surface are key parameters to measure the coating quality.

In the semiconductor manufacturing industry, the factors causing abnormal photoresist coating exist widely, majority of which are caused by the machine failure. However, one of the factors caused by the structure of the photoresist bottle, often occurs and cannot be solved by the machine maintenance.

Referring to FIG. 1, which is a schematic view illustrating a photoresist bottle according to the prior art. As shown in the FIG. 1, the prior photoresist bottle usually adopts the NOWPak packaging, which comprises an inner liner and an external shell. Wherein, the external shell is a photoresist bottle body 1 having a connector 5, and the inner liner is a soft liner 2 used to fill with the photoresist 3, the photoresist 3 is out of touch with the outer air and the bottle body 1. A nitrogen gas tube 6 is inserted into the interspace between the bottle body 1 and the soft liner 2 through the connector 5. A photoresist conduit 4 is inserted into the bottom of the soft liner 2 through the connector 5. A hose 7 is connected to the upper end of the photoresist conduit 4 in the connector 5. Due to the photoresist bottle has been sealed, when the nitrogen gas is introduced through the nitrogen gas tube 6 by the high pressure to press the soft liner 2, the photoresist 3 is extruded out through the photoresist conduit 4, and guided to the machine via the hose 7. Referring to FIG. 2, which is a fragmentary enlarged schematic view illustrating the photoresist conduit in the FIG. 1. As shown in the FIG. 2, the lower end 8 of the photoresist conduit 4 is cone shaped, of which sidewall arranges a photoresist outlet 9.

During the photoresist is extruded out through the photoresist conduit 4, the photoresist outlet 9 is usually blocked by the deformed soft liner 2 under the combined effect of the pressing of the nitrogen gas outside the soft liner and the suction of the photoresist outlet 9 inside the soft liner. The blocked photoresist outlet 9 will alter the pressure of the subsequent photoresist pipeline, cause the emergence of a large number of bubbles therein, and further more badly cause the abnormal coating due to the insufficient of the photoresist during the coating process.

The above-mentioned case will happen more easily when the photoresist will be run out. As shown in the FIG. 3, the soft liner 2 is gradually close to the photoresist conduit 4 when the photoresist therein will be run out. The photoresist 3 in the top of the soft liner not only is difficult to flow smoothly to the photoresist outlet 9 positioned at the lower end of the photoresist conduit 4, but also is easier to block the photoresist outlet 9.

Therefore, it is necessary to perform a structure optimization for the prior photoresist bottle, in order to solve the poor coverage problem of coating.

BRIEF SUMMARY OF THE DISCLOSURE

To overcome the problems as mentioned above, it is an object of the present invention to provide a photoresist bottle capable of improving poor coating coverage. The present invention can solve the problem of blocking the photoresist outlet due to the deformed soft liner within the photoresist bottle, and further solve the problems of the air bubbles and abnormal coating caused by the blocking.

To achieve above object, technical solutions of the present invention are as follows:

A photoresist bottle capable of improving poor coating coverage, comprising: a sealed photoresist bottle body having a connector, a hard groove-shaped projection fixed on the bottom of the bottle body, an inner liner having an opening at the bottom, which is hermetically connected to the groove sidewall of the projection and is used to fill with the photoresist, a nitrogen gas tube inserting into the interspace between the bottle body and the soft liner through the connector, and a photoresist conduit inserting into the soft liner through the connector; wherein, the top of the inner liner is hermetically connected to the upper lateral wall of the photoresist conduit, the lower end of the photoresist conduit reaches within the groove of the projection.

Preferably, a photoresist outlet is positioned at the lower end of the photoresist conduit and is concave toward the interior of the photoresist conduit.

Preferably, a pluralities of photoresist inlets are positioned arranging around the sidewall of the photoresist conduit lower end, and a photoresist outlet is positioned at the interior of the photoresist conduit and a little higher than the photoresist inlets.

Preferably, the photoresist inlets are hole-shaped or groove-shaped opening downward.

Preferably, the photoresist inlets are positioned evenly arranging around the sidewall of the photoresist conduit lower end.

Preferably, the number of the photoresist inlets is 4-8, symmetrically arranging around the sidewall of the photoresist conduit lower end.

Preferably, the lower end face of the photoresist conduit is close to or in contact with the groove bottom of the projection in the bottom of the bottle body.

Preferably, the photoresist inlets are positioned lower than the groove upper end of the projection in the bottom of the bottle body.

Preferably, the opening at the bottom of the soft liner is hermetically connected to the groove outer sidewall of the projection in the bottom of the bottle body.

Preferably, supporting feet are positioned at the lower end of the photoresist conduit.

Concluded from the above technical solutions, the present invention has fixed a groove-shaped projection in the bottom of the photoresist bottle body, and hermetically connected the opening of the soft liner to the groove sidewall of the projection, and made the lower end of the photoresist conduit reach within the groove of the projection. When the soft liner is pressed, since unable to touch the photoresist outlets at the lower end of the photoresist conduit, a blocking can be avoided. Thereby, air bubbles and coating problems are prevented.

DETAILED DESCRIPTION OF THE EMBODIMENTS

Figure 1:
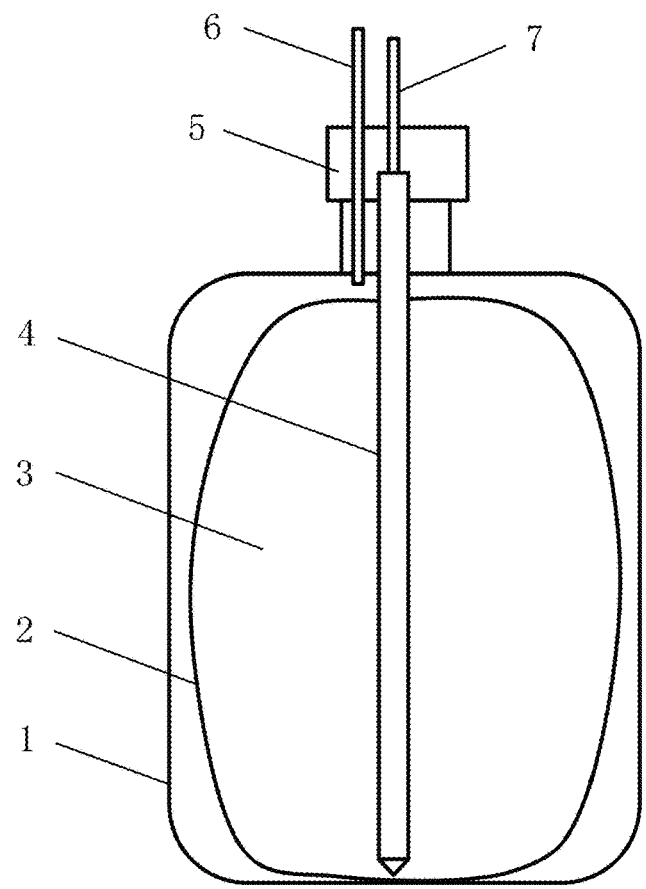
FIG. 1 is a schematic view illustrating a photoresist bottle according to the prior art.
Figure 2:
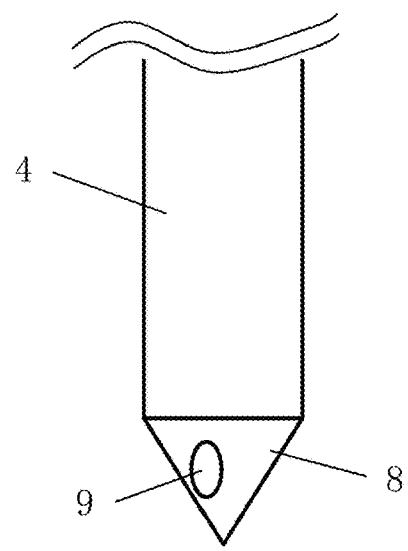
FIG. 2 is a fragmentary enlarged schematic view illustrating the photoresist conduit in the FIG. 1.
Figure 3:
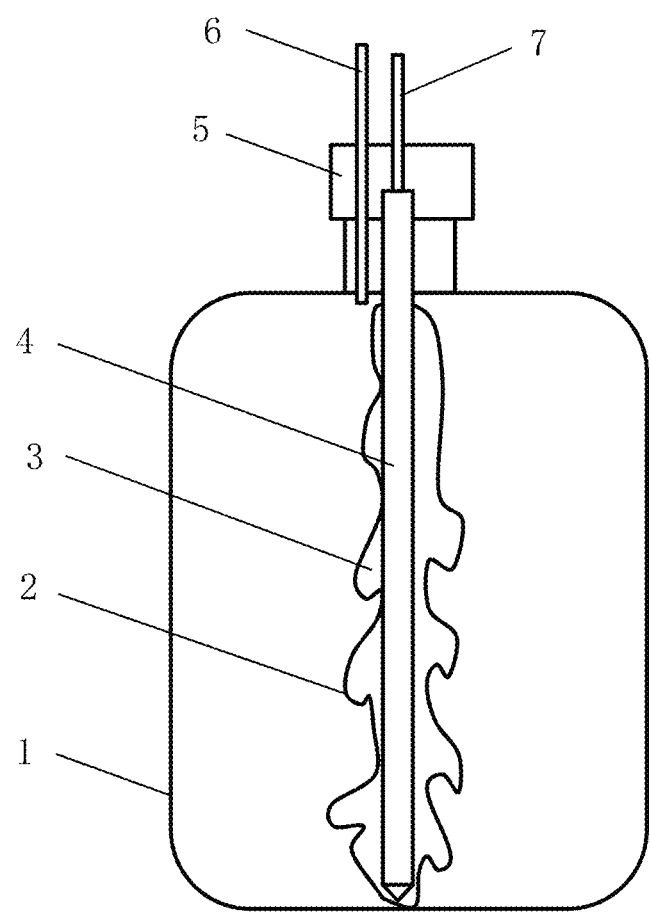
FIG. 3 is a schematic view illustrating the using state of the photoresist bottle in the FIG. 1 when the photoresist therein will be run out.

The present invention will be described in further details hereinafter by referring to the accompanying drawings, so as to provide a better understanding of the present invention.

It should be noted that, in the following specific embodiments, when these embodiments of the present invention are described in detail, in order to clearly illustrate the structure of the present invention to facilitate explanation, the accompanying drawings are not necessarily drawn to scale, some features in the drawings may have been fragmentary enlarged, deformed or simplified. Therefore, it should be avoided to understand this as a limitation to the present invention.

Figure 4:
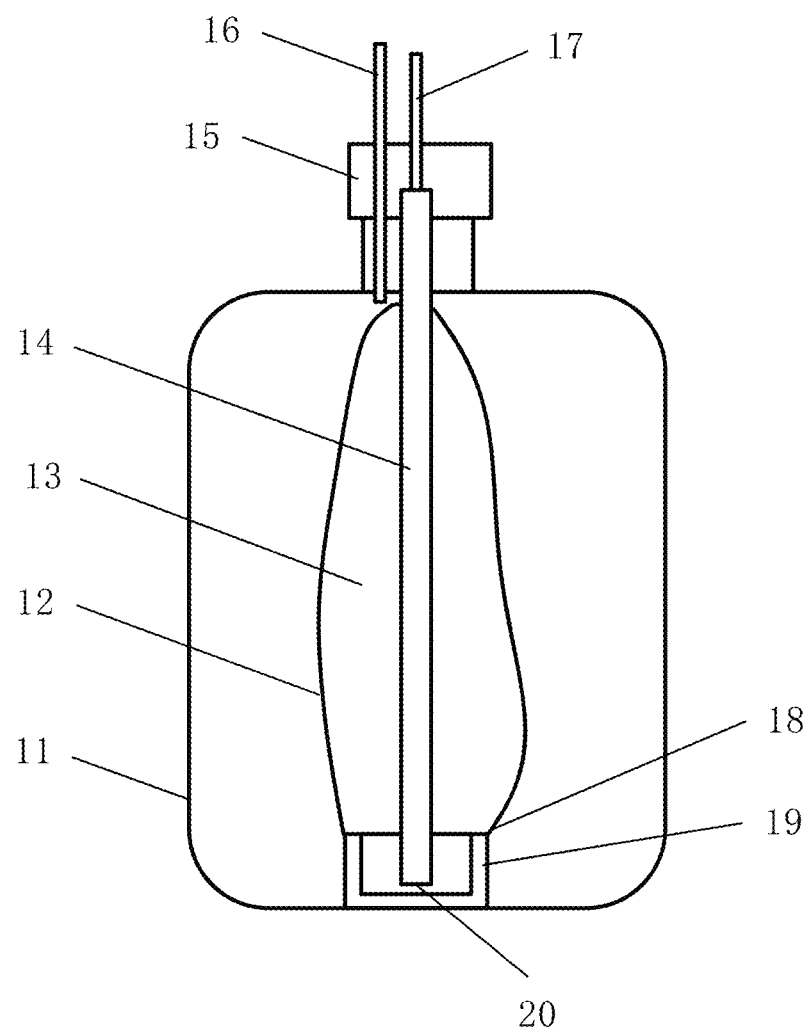
FIG. 4 is a schematic view illustrating a photoresist bottle capable of improving poor coating coverage according to a preferred embodiment of the present invention.

Referring to FIG. 4, which is a schematic view illustrating a photoresist bottle capable of improving poor coating coverage according to a preferred embodiment of the present invention. As shown in the FIG. 4, a photoresist bottle capable of improving poor coating coverage is disclosed by the present invention, which comprising: a sealed photoresist bottle body having a connector, a hard groove-shaped projection fixed on the bottom of the bottle body, an inner liner having an opening at the bottom, which is hermetically connected to the groove sidewall of the projection and is used to fill with the photoresist, a nitrogen gas tube inserting into the interspace between the bottle body and the soft liner through the connector, and a photoresist conduit inserting into the soft liner through the connector. The photoresist is out of touch with the outer air and the bottle body 11.

Referring to FIG. 4, again. The top of the inner liner is hermetically connected to the upper lateral wall of the photoresist conduit, and the lower end of the photoresist conduit reaches within the groove of the projection. Due to the photoresist bottle has been sealed by the connector, when the nitrogen gas is introduced through the nitrogen gas tube 16 by the high pressure to press the soft liner 12, the photoresist 13 is introduced from the photoresist outlet 20 positioned at the lower end of the photoresist conduit 14, and extruded out from the upper end of the photoresist conduit 14, finally guided to the machine via the hose 17 to perform a coating process.

As an alternative embodiment, the projection 19 could be rounded-shaped, rectangle-shaped, polygonal-shaped, or bowl-shaped. The opening 18 positioned at the lower end of the soft liner 12 is matched and hermetically connected with the groove sidewall of the projection 19. The materials manufacturing the soft liner 12 and the bottle body 11 could be arbitrary and will not be restricted by the present invention. As a preferred embodiment, the opening 18 positioned at the bottom of the soft liner 12 can be hermetically connected to the groove outer sidewall of the projection 19. Or the opening 18 positioned at the bottom of the soft liner 12 also can be hermetically connected to the groove inner sidewall of the projection 19, at the same time, their connection position should be at the upper end of the groove inner sidewall, in order to avoid the deformed soft liner to block the outlet of the photoresist conduit. Due to the lower end of the soft liner 12 connecting with the groove, it is difficult to touch the photoresist outlet 20 at the lower end of the photoresist conduit 14 when the soft liner 12 is pressed. Therefore, the photoresist outlet 20 can be avoided blocking.

Figure 8:
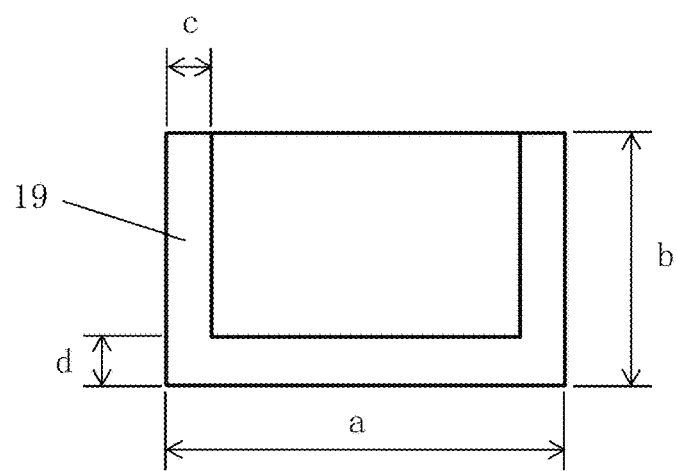
FIG. 8 is an enlarged schematic view illustrating the projection in the FIG. 4.

Referring to FIG. 8, which is an enlarged schematic view illustrating the projection in the FIG. 4. As shown in the FIG. 8, in one embodiment, take the rounded-shaped groove as an example, the sizes of each part of the projection 19 are as follows: the diameter a=3.8-4.2 cm; the height b=1.8-2.2 cm; the sidewall thickness of the groove c=0.4-0.6 cm; the bottom thickness d=0.4-0.6 cm. Specially, for example, the diameter a=4 cm; the height b=2 cm; the sidewall thickness of the groove c=0.5 cm; the bottom thickness d=0.5 cm. The size of the projection can be properly chosen according to the size of the photoresist bottle.

As another alternative embodiment, the photoresist outlet 20 can be positioned at the lower end face of the photoresist conduit. In this case, the lower end face of the photoresist conduit 14 should be close to not touch the groove bottom of the projection 19. Therefore, a certain distance is remained, so as to allow the smooth introduction of the photoresist.

Figure 5:
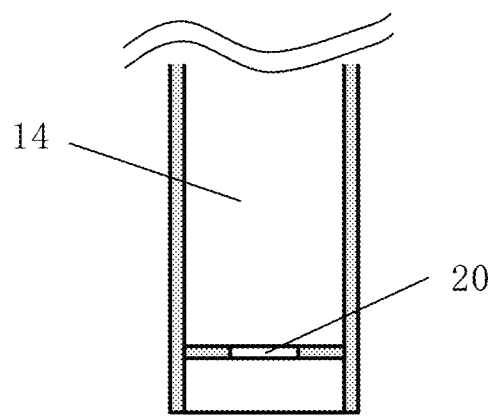
FIG. 5 is a fragmentary enlarged schematic view illustrating the first kind structure of the photoresist conduit lower end in the FIG. 4.

Referring to FIG. 5, which is a fragmentary enlarged schematic view illustrating the first kind structure of the photoresist conduit lower end in the FIG. 4. As shown in the FIG. 5, as a preferred embodiment, the photoresist outlet 20 is positioned at the lower end of the photoresist conduit 14 and is concave toward the interior of the photoresist conduit. In other words, the photoresist outlet 20 is positioned higher than the lower end face of the conduit 14. In this case, when the soft liner 12 is pressed and shrunk toward the photoresist conduit 14, the photoresist outlet 20 is hardly blocked even if the soft liner 12 is seriously shrunk and deformed, due to the prevention of the lower end sidewall of the conduit. The lower end of the photoresist conduit 14 should also be close to not touch the groove bottom of the projection 19. Therefore, a certain distance is remained, so as to allow the smooth introduction of the photoresist.

Figure 6:
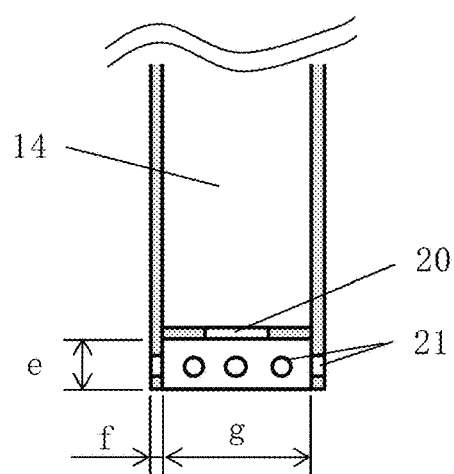
FIG. 6 is a fragmentary enlarged schematic view illustrating the second kind structure of the photoresist conduit lower end in the FIG. 4.

Referring to FIG. 6, which is a fragmentary enlarged schematic view illustrating the second kind structure of the photoresist conduit lower end in the FIG. 4. As shown in the FIG. 6, as a preferred embodiment, a plurality of photoresist inlets 21 are positioned arranging around the sidewall of the photoresist conduit 14 lower end, and the photoresist outlet 20 is positioned at the interior of the photoresist conduit and higher than the photoresist inlets 21. The photoresist inlets 21 can be arranged around the sidewall of the photoresist conduit 14 lower end. In this case, when the soft liner 12 is pressed and shrunk toward the photoresist conduit 14, all of the photoresist inlets 21 are hardly blocked even if the soft liner 12 is seriously shrunk and deformed, due to the arrangement of the photoresist inlets 21 around the sidewall of the photoresist conduit 14 lower end. Therefore, the photoresist outlet 20 cannot be blocked. The lower end of the photoresist conduit 14 can touch the groove bottom of the projection 19 when the photoresist conduit 14 is inserted into the soft liner 12.

As another preferred embodiment, the photoresist inlets 21 could be hole-shaped, groove-shaped opening downward, or zigzag-shaped. In the embodiment of the FIG. 6, rounded hole-shaped photoresist inlets 21 are employed. Preferably, the photoresist inlets 21 can be positioned evenly arranging around the sidewall of the photoresist conduit 14 lower end. Further, the number of the photoresist inlets is 4-8, symmetrically arranging around the sidewall of the photoresist conduit 14 lower end.

For the conduit structure having the photoresist inlets 21, which is mentioned in the FIG. 6, the photoresist inlets 21 should be positioned lower than the groove upper end of the projection 19. Therefore, even though the photoresist 13 is run out, the pressed and deformed soft liner 12 would not be easy to trap into the groove. Therefore, it is difficult to touch the photoresist inlets 21 for the soft liner 12.

Referring to FIG. 6, again. In one embodiment, take the rounded hole-shaped photoresist inlets 21 as an example, the sizes of each part of the conduit 14 lower end are as follows: the height from the photoresist outlet to the lower end face of the conduit e=0.9-1.1 cm; the sidewall thickness of the conduit f=0.25-0.35 cm; the inner diameter of the conduit g=1.3-1.5 cm; the diameter of the photoresist outlet 20 h=0.6-0.8 cm; the diameter of the photoresist inlet 21 i=0.4-0.6 cm. Specially, for example, the height from the photoresist outlet to the lower end face of the conduit e=1 cm; the sidewall thickness of the conduit f=0.3 cm; the inner diameter of the conduit g=1.4 cm; the diameter of the photoresist outlet 20 h=0.7 cm; the diameter of the photoresist inlet 21 i=0.5 cm. The size of the conduit lower end can be properly chosen according to the size of the photoresist bottle.

Figure 7:
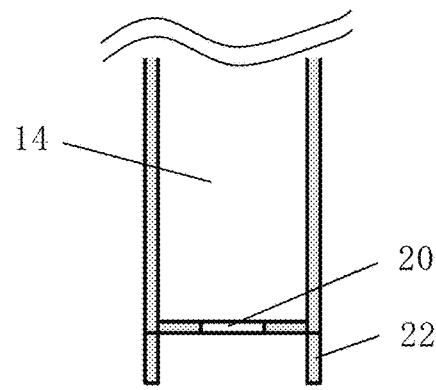
FIG. 7 is a fragmentary enlarged schematic view illustrating the third kind structure of the photoresist conduit lower end in the FIG. 4.

Referring to FIG. 7, which is a fragmentary enlarged schematic view illustrating the third kind structure of the photoresist conduit lower in the FIG. 4. As shown in the FIG. 4, as another alternative embodiment, supporting feet 22 are positioned at the lower end of the photoresist conduit. Further, the number of the supporting feet 22 is one or more, which are arranged around the conduit lower end. The supporting feet can play a similar role to the photoresist inlets in the FIG. 6, so the present embodiment will not repeat them.

In summary, the present invention has fixed a groove-shaped projection in the bottom of the photoresist bottle body, and connected the lower end of the soft liner to the groove sidewall of the projection, and made the lower end of the photoresist conduit reach within the groove of the projection. When the soft liner is pressed, since unable to touch the photoresist outlets at the lower end of the photoresist conduit, a blocking can be avoided. Thereby, air bubbles and coating problems are prevented. In addition, the present photoresist bottle can be suitable for different kinds of photoresist materials (e. g., G-line, I-line, Krf or Arf), anti-reflective coating materials, filling materials, impermeable coating materials, and so on, and also suitable for lithography machines with various sizes, e. g., 5 inches, 6 inches, 8 inches, 12 inches and other larger-sized lithography machines.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A bottle for storing and dispensing a photoresist fluid capable of improving poor coating coverage, comprising:
   a bottle having a sealed body having an exterior wall with a connector proximate the top end of the sealed body, a bottom wall proximate the lower end of the sealed body, and a conduit with a conduit upper sidewall, and a conduit lower end, the conduit lower end positioned proximate the lower end of the sealed body,
   a sump element that is made from a rigid material, has a sump element sidewall, and is fixed to the bottom wall,
   an inner tube made of flexible material and positioned within the sealed body, the inner tube having an lower opening end proximate the bottom wall, wherein the lower opening end is sealed to the sump element sidewall at a point that is above the conduit lower end, the inner tube having an upper opening end proximate the top wall, wherein the inner tube is selectively filled with photoresist fluid,
   a tube for introducing nitrogen gas, wherein the tube is located on the connector and is fluidly connected to a space between the exterior wall of the sealed body and the inner tube, wherein, the conduit is positioned within the inner tube and is fluidly connected to the connector;
   wherein, the upper opening end of the inner tube is sealed to the conduit upper sidewall, and the conduit lower end extends into the sump element.

2. The bottle according to claim 1, wherein a photoresist outlet is positioned at the conduit lower end and is concave toward the interior of the conduit.

3. The bottle according to claim 1, wherein a plurality of photoresist inlets are positioned arranged around the sidewall of the conduit lower end, and a photoresist outlet is positioned at the interior of the conduit and a little higher than the photoresist inlets.

4. The bottle according to claim 3, wherein the photoresist inlets are semi-circular or scalloped opening downward.

5. The bottle according to claim 3, wherein the photoresist inlets are positioned symmetrically arranged around the sidewall of the conduit lower end.

6. The bottle according to claim 4, wherein the photoresist inlets are positioned symmetrically arranged around the sidewall of the conduit lower end.

7. The bottle according to claim 3, wherein the photoresist inlets are between 4 and 8, symmetrically arranged around the sidewall of the conduit lower end.

8. The bottle according to claim 4, wherein the photoresist inlets are between 4 and 8, symmetrically arranged around the sidewall of the conduit lower end.

9. The bottle according to claim 3, wherein the conduit lower end is close to or in contact with a sump element bottom wall of the sump element.

10. The bottle according to claim 3, wherein the photoresist inlets are positioned lower than the upper end of the sump element.

11. The bottle according to claim 9, wherein the photoresist inlets are positioned lower than the upper end of the sump element.

12. The bottle according to claim 1, wherein the lower opening end is sealed to an outer surface of the sump element sidewall.

13. The bottle according to claim 1, wherein supporting feet are positioned at the conduit lower end.

* * * * *